United States Patent
Gavagnin et al.

(10) Patent No.: US 11,659,648 B2
(45) Date of Patent: May 23, 2023

(54) METAL BODY FORMED ON A COMPONENT CARRIER BY ADDITIVE MANUFACTURING

(71) Applicant: AT&S Austria Technologie & Systemtechnik Aktiengesellschaft, Leoben (AT)

(72) Inventors: Marco Gavagnin, Leoben (AT); Jonathan Silvano de Sousa, Vienna (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 16/152,659

(22) Filed: Oct. 5, 2018

(65) Prior Publication Data

US 2019/0110357 A1    Apr. 11, 2019

(30) Foreign Application Priority Data

Oct. 6, 2017  (EP) .................................... 17195322

(51) Int. Cl.
*H05K 1/02* (2006.01)
*H05K 1/09* (2006.01)
(Continued)

(52) U.S. Cl.
CPC ............ *H05K 1/0206* (2013.01); *B22F 7/08* (2013.01); *B33Y 10/00* (2014.12); *B33Y 80/00* (2014.12); *H05K 1/021* (2013.01); *H05K 1/0209* (2013.01); *H05K 1/0353* (2013.01); *H05K 1/09* (2013.01); *H05K 1/181* (2013.01); *H05K 1/185* (2013.01); *H05K 3/1241* (2013.01);
(Continued)

(58) Field of Classification Search
CPC ................................................... H05K 1/0206
See application file for complete search history.

(56) References Cited

U.S. PATENT DOCUMENTS 4,978,914 A * 4/1990 Akimoto et al.
5,060,114 A * 10/1991 Feinberg et al.
(Continued)

FOREIGN PATENT DOCUMENTS

| CN | 103237285 A | 8/2013 |
| CN | 105916802 A | 8/2016 |

(Continued)

OTHER PUBLICATIONS

Wroe, Jonnathan: "Introduction to Additive Manufacturing technology" www.epma.com Oct. 31, 2015 pp. 1-42; xp002779171, Shrewsburry, UK, Retrieved from the Internet:URL: https://futurerobotics.files.wordpress.com/2015/10/epma_introduction_to-additive_manufacturing_technology.pdf [retrieved on Mar. 21, 2018] * pp. 8-15,23*.

(Continued)

*Primary Examiner* — Timothy J Thompson
*Assistant Examiner* — Rhadames Alonzo Miller
(74) *Attorney, Agent, or Firm* — Robert A. Blaha; Smith Tempel Blaha LLC

(57) ABSTRACT

A component carrier includes a carrier body formed of a plurality of electrically conductive layer structures and/or electrically insulating layer structures, a metal surface structure coupled to the layer structures and a metal body directly on the metal surface structure formed by additive manufacturing.

15 Claims, 3 Drawing Sheets

(51) Int. Cl.
*H05K 1/03* (2006.01)
*H05K 3/46* (2006.01)
*H05K 1/18* (2006.01)
*B22F 7/08* (2006.01)
*B33Y 80/00* (2015.01)
*B33Y 10/00* (2015.01)
*H05K 3/12* (2006.01)
*B22F 10/20* (2021.01)

(52) U.S. Cl.
CPC ......... *H05K 3/4644* (2013.01); *H05K 3/4664* (2013.01); *B22F 10/20* (2021.01); *H05K 2201/064* (2013.01); *H05K 2201/066* (2013.01); *H05K 2203/0126* (2013.01); *H05K 2203/0195* (2013.01); *H05K 2203/107* (2013.01)

(56) References Cited

U.S. PATENT DOCUMENTS

| | | | |
|---|---|---|---|
| 6,215,093 B1 | 4/2001 | Meiners et al. | |
| 2009/0266582 A1 | 10/2009 | Sakurai et al. | |
| 2009/0279259 A1 | 11/2009 | Cripe et al. | |
| 2009/0321045 A1 | 12/2009 | Hernon et al. | |
| 2010/0065256 A1* | 3/2010 | Wilcoxon | F28D 15/00 165/104.31 |
| 2010/0109688 A1 | 5/2010 | Eldridge et al. | |
| 2011/0244636 A1 | 10/2011 | Kondo | |
| 2011/0253435 A1 | 10/2011 | Huang et al. | |
| 2012/0118615 A1* | 5/2012 | Lee et al. | |
| 2012/0326292 A1* | 12/2012 | Ohashi | H01L 23/3677 257/690 |
| 2015/0096788 A1 | 4/2015 | Wilkins | |
| 2015/0173203 A1 | 6/2015 | Din | |
| 2015/0201500 A1* | 7/2015 | Shinar | H05K 3/125 425/132 |
| 2015/0237762 A1 | 8/2015 | Holt et al. | |
| 2016/0183380 A1* | 6/2016 | Ishii et al. | |
| 2016/0278200 A1* | 9/2016 | Costes | H05K 1/0206 |
| 2016/0345875 A1 | 12/2016 | Schimmoeller et al. | |

FOREIGN PATENT DOCUMENTS

| | | | |
|---|---|---|---|
| DE | 10 2007 015 399 A1 | 10/2008 | |
| DE | 10 2007 050 405 A1 | 4/2009 | |
| DE | 10 2014 201 121 A1 | 7/2015 | |
| DE | 10 2014 201 306 A1 | 7/2015 | |
| DE | 102014201121 A1 * | 7/2015 | ............ H01L 21/56 |
| DE | 10 2016 218 968 A1 | 4/2018 | |
| GB | 2 538 522 A | 11/2016 | |
| WO | WO2008102266 A2 | 8/2008 | |
| WO | WO2014173419 A1 | 10/2014 | |
| WO | 2015028716 A1 | 3/2015 | |
| WO | WO2017001369 A1 | 1/2017 | |
| WO | WO2017055599 A1 | 4/2017 | |

OTHER PUBLICATIONS

Whittaker, Paul; "Metal Additive Manufacturing", ipmd.net, Sep. 30, 2014 (Sep. 30, 2014), pp. 1-90, XP002779172, Shrewsbury, UK Retrieved from the Internet:URL:http://www.pm-review.com/powder-metallurgy-review-archive/powder-metallurgy-review-vol-3-no-2-summer-2014/ [retrieved on Mar. 21, 2018] * pp. 43,44 *.

ANON: "Metal powders for additive manufacturing", Sandvik Osprey Ltd., Sep. 30, 2010 (Sep. 30, 2010), XP002779173, Retrieved from the Internet:URL:https://www.materials.sandwik/globalassets/global/downloads/products_downloads/metal_powders/s-po009-ps-eng-09.2010.pdf [retrieved on Mar. 21, 2018] * the whole document*.

Office Action in Application No. 201811169100.1; pp. 1-8; dated Nov. 10, 2020; China National Intellectual Property Administration, No. 6, Xitucheng Lu, Jimenqiao Haidian District, Beijing City, 100088, China.

Dongbing, C.; Search Report in Application No. 201811169100.1 (Translated); pp. 1-2; dated Nov. 3, 2020; China National Intellectual Property Administration, No. 6, Xitucheng Lu, Jimenqiao Haidian District, Beijing City, 100088, China.

Dongbing, C.; Office Action in Application No. 201811169100.1 (Translated); pp. 1-6; dated Nov. 10, 2020; China National Intellectual Property Administration, No. 6, Xitucheng Lu, Jimenqiao Haidian District, Beijing City, 100088, China.

Simon, V.; Communication Pursuant to Article 94(3) EPC in Application No. 17 195 322.7; pp. 1-7; Mar. 26, 2021 European Patent Office, Postbus 5818, 2280, HV Rijswijk, Netherlands.

* cited by examiner

US 11,659,648 B2

METAL BODY FORMED ON A COMPONENT CARRIER BY ADDITIVE MANUFACTURING

TECHNICAL FIELD

The invention relates to a component carrier and to a method of manufacturing a component carrier formed by using by additive manufacturing.

TECHNOLOGICAL BACKGROUND

In electronic components, such as power devices and power LEDs, heat dissipation in circuitries of component carriers is of great importance due to the increasing power density per unit area of active components, both at the component carrier, e.g. a printed circuit board (PCB), and with respect to the packaging level. As an example, a widely used solution involves mounting a heat sink on the surface portion of the PCB or package which is needed to be cooled down. A heat sink is a passive heat exchanger that cools a device by dissipating heat into the surrounding medium.

For example, a glue, i.e. epoxy or tape, may be used for allowing a good adhesion of the heat sink to the PCB. However, the heat conductivity of an epoxy material or an adhesive tape is limited with respect to metal materials, such as aluminum or copper, which are generally constituting the heat sink itself.

SUMMARY

There may be a need to provide a component carrier providing a proper thermal heat management and which can be manufactured efficiently.

A component carrier and a method of manufacturing a component carrier according to the independent claims are provided.

According to a first aspect of the invention a component carrier is presented. The component carrier comprises a carrier body formed of a plurality of electrically conductive layer structures and/or electrically insulating layer structures, a metal surface structure coupled to the layer structures and a metal body directly on the metal surface structure formed by additive manufacturing.

According to a further aspect of the invention, a method of manufacturing a component carrier is presented. A stack of a plurality of electrically conductive layer structures and/or electrically insulating layer structures are connected for forming a carrier body. A metal surface structure is formed on and/or coupled to the layer structures. A metal body is formed directly on the metal surface structure by additive manufacturing.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board (PCB), an organic interposer, and an IC (integrated circuit) substrate. A component carrier may also be a hybrid board combining different ones of the above mentioned types of component carriers.

The component carrier comprises the carrier body having a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

The metal surface structure forms a thermal and/or electrical connection to the metal body. The metal surface structure comprises for example a metal foil, and particular a copper foil. Furthermore, the metal surface structure may have a plane (uncurved), two-dimensional extension. However, the metal surface structure may also comprise complex three-dimensional structures, such as protrusions forming thermal and/or electrical connections. The metal surface structure may be also curved for being supported by respectively curved and flexible carrier bodies (such as flex PCBs). In an exemplary embodiment, the metal surface structure may be formed in or on the carrier body by additive manufacturing.

In the context of the present application, the term "additive manufacturing" may particularly denote a manufacturing procedure of the metal body according to which the metal body is manufactured by the sequential addition of portions of material which, when taken together, constitute the metal body. By such an additional manufacturing, stable and specifically thermal conductive formation of the metal body is possible without the need to glue the metal body to the metal surface structure and hence without the need of further intermediate adhesive layers and the like. Exemplary manufacturing processes for additive manufacturing are described in the following exemplary embodiments below. For example, 3D printing techniques, selective laser sintering (SLS), selective laser melting (SLM) and/or extra procedures can be applied for conducting additive manufacturing.

The manufacture of the component carrier may be completed (for instance by carrying out PCB manufacturing procedures) before a 3D print head is activated or controlled to form the metal body directly on the metal surface structure. Such a three-dimensional printing may be accomplished on the basis of printing material (such as powder-based techniques material) which is sintered or melted with the metal surface by e.g. spatially limited thermal treatment, for example by a laser. Moreover, it is also possible that the metal body is formed by ejecting droplets of melted printing material via a nozzle or the like, such as an extruder device or a plasma spray device, for forming layers of the metal body which are solidified after being applied to the metals surface structure or an already solidified layer of the metal body. Depending on the adoption of the additive manufacturing technique, each layer of the metal body may have a thickness of about 10 μm (Micrometer) to 50 μm for powder-based methods. However, It is possible to decrease the layer thickness (<1 μm) with other techniques such as ejecting melted metal droplets. The metal body may comprise a material selected of at least one of the group consisting of copper, aluminum and steel.

In the context of the present document, the metal body may particularly denote a structure formed by an additive manufacturing procedure. In particular, three dimensionally printing as additive manufacturing procedure comprises for example 3D printing with powder, 3D printing with melted materials or 3D printing with fluid materials. 3D printing with powder may particularly denote the use of powder as printing material for the 3D printing. A further process using a printing material e.g. in powder form is selective laser sintering/melting (SLS/SLM), depending whether the delivered local energy is sintering or melting layers together. A further process using printing material in powder form is electron beam melting (EBM, or also called electron beam additive manufacturing EBAM). 3D printing by melt materials may particularly denote fused filament fabrication (FFF) or fused deposition modeling (FDM). Melted materials which will be used for this process may be in particular plastics like ABS or PLA. 3D printing by fluid materials may particularly denote the manufacturing process which is working on the basis of photosensitive fluid, such as fluidic UV-sensitive plastics (photopolymer). In particular, the 3-D printing with fluid materials may denote a so-called stereo lithography process (SLA). During this process the metal body is also formed layer by layer.

By applying additive manufacturing the metal body is directly formed on the metal surface structure. Hence, by using an additive manufacturing, the metal body is arranged directly on the surface structure without the need of any intermediate layers between the metal body and the metal surface structure. According to an exemplary embodiment, the metal body is arranged directly on the metal surface structure without material/layers in between. Furthermore, any combination of metals is possible, such as Cu/Cu (Copper/Copper) or Al/Cu (Aluminum/Copper) or Cu/Ni/Au (Copper/Nickel/Gold) etc.

Therefore, by the approach of the present invention, according to an exemplary embodiment, a proper thermal conductivity and/or electrical conductivity between the metal body and the metal surface structure and the carrier body, respectively, can be provided, because the metal body and the metal surface structure may be made of highly thermal and/or electrical conductive material. Specifically, the metal surface structure and the metal body may be made of similar or the same metal components such that no loss of thermal and/or electrical conductivity at the interface between the metal body and the metal surface structure is generated, for example due to the use of different materials between the metal surface structure and the metal body. For example, the metal surface structure and the metal body may consist of the same material such that an interface between the metal surface structure and the metal body is indistinguishable from each other.

For example, if the metal body should function as a heat sink, the heating is formed by the additive manufacturing on the component and the component carrier, respectively, itself, so that any heat resistive layers affecting the heat dissipation from the component are avoided. In other words, a metal-metal bond is provided between the heat sink and the metal surface on the PCB (component carrier), avoiding any glue, tape or thermal interface material (TIM), so that it may be possible to enhance the heat conductivity of current available heat sink mount technologies of about 100 up to 300 times. The metal body may comprise a material selected of at least one of the group consisting of copper, aluminum, silver, nickel, bronze, gold, titanium, tantalum, wolfram, molybdenum and steel. Another point to be emphasized is the fact that an interface between the heat sink (metal body) and the metal surface structure can be provided continuous and homogenous so that no gaps or cavities are formed along the interface. For this reason, corrosion can be avoided and a efficient heat transport expected.

Furthermore, the additive manufacturing for forming the metal body is highly automate and no assembly of heat spreading structure is necessary since it is directly manufactured on the electronic component (PCB or package), implying lower manufacturing costs. Additive manufacturing allows the production of heat spreading structures with enhanced thermal conductivity controlled on the microstructural level.

According to a further exemplary embodiment, the metal body comprises cooling fins wherein the cooling fins comprise for example a fractal geometry. The cooling fins can also specially have a parafuse format. Cooling fins form protrusions protruding from the surface of the metal body in order to increase the overall surface area of the metal body. Hence, the overall surface area provides a larger surface so that the thermal conductivity with the environment of the component carrier can be provided. Specifically, by additive manufacturing small and complex three-dimensional fin shapes can be manufactured.

According to a further exemplary embodiment, the metal body is a heat removal body, in particular one of a heat sink, a heat pipe or a tube for forced water flow.

The metal body forming a heat sink may form a variety of designs due to the additive manufacturing. For example, the metal body may form a plurality of lamellas and the above described cooling fins in order to increase the heat radiation surface of the metal body. Specially, heat sinks with enhanced heat dissipation due to geometrical effects (fractal geometries), which are not easily realized with regular heat sink manufacturing methods can be formed directly on the PCB.

According to a further exemplary embodiment, the metal body functioning as a heat pipe comprises a tube extending at least partially along the metal surface structure. The metal body forming a heat pipe comprises an inner cavity forming e.g. a tube-like shape within an internal cooling fluid is flowable. The cooling fluid may be a gas or a liquid fluid. The heat pipe is a heat-transfer device that combines the principles of both thermal conductivity and phase transition to efficiently manage the transfer of heat between two solid interfaces, for example the metal surface structure on the one side and the environment of the metal body on the other side. At the hot interface of the heat pipe at the metal surface structure, the cooling fluid in contact with a thermally conductive solid surface (i.e. at the metal surface structure) turns into a vapor by absorbing heat from that surface. The vapor then travels along the heat pipe to the cold interface and condenses back into a liquid to thereby releasing the latent heat. The liquid then returns to the hot interface by capillary action, centrifugal force, or gravity, and the cycle repeats. Due to the very high heat transfer coefficients for boiling and condensation, heat pipes are highly effective thermal conductors.

According to a further exemplary embodiment, the tube surrounds at least partially a heat generating component. The heat generating components may be for example an electrical component as described below. Furthermore, the component may be for example a conductive line or another electrical guiding element. Hence, the tube forming a heat pipe may be formed in such a way, that the tube surrounds partially or completely the heat generating components. For example, the tube may have a ring shape, wherein the center of the ring the heat generating component is arranged. Furthermore, the tube may comprise a heat radiation section which is located spaced apart a certain distance from the component. The tube comprises an inner cavity through which a cooling fluid flows. Thereby, the tube forms a heat pipe, wherein the cooling fluid receives the thermal energy from the heat generating component and flows further to the heat radiation section of the tube, where the thermal energy is transferred from the cooling fluid to the environment in order to cool down the cooling fluid. Hence, the cooled cooling fluid flows back to the region partially surrounding the heat generating components for receiving again thermal energy from the heat generating component. Specifically, by additive manufacturing, the design of the tube may be flexible, such that the run and extension, respectively, of the tube along the component carrier may be individually adjusted. For example, the tube may extend in a meander-like manner along the metal surface structure. For example, the tube may partially surround one or a plurality of heat generating components, such that the cooling fluid may pass more than one heat generating components for cooling purposes. The same tube can be used for active cooling whereas both ends of the tube are open and connected to a closed circuit attached to a pump which is used to forcefully let a cooling fluid flow and cool the electronic device.

According to a further exemplary embodiment, the metal body comprises at least one locally roughened surface which has a higher roughness than other surfaces of the metal body for providing a heat exchange with a cooling medium. For example, by selecting a rest directive printing material for additive manufacturing having a larger particle size, a rough surface of the metal body may be formed. For example specifically, by using selective laser sintering/melting (SLS/SLM) a rough surface of the metal body can be formed. The result of a locally roughened surface is that the heat radiation capacity of the locally roughened surface is increased, so that by the locally roughened surface a higher heat transfer to the environment is provided then by the smoother and less rough surfaces of the metal body adjacent to the locally roughened surface. Hence, by forming locally roughened surface regions of higher heat transfer can be adjusted, so that the thermal management of the component carrier can be adjusted exactly.

According to a further exemplary embodiment, the metal surface structure and/or the metal body form an electrical contact element, in particular a contact pad, a contact line or a plated area. For example, the metal body and/or the metal surface structure may form protrusions which function as an electrical contact.

According to a further exemplary embodiment, the metal body is formed within a contact hole of the carrier body, such that the metal body and the metal surface structure forms an electrical contacting structure. For example, a contact hole may be formed by mechanical drilling or heat (laser) drilling in the carrier body. As a desired location inside the contact hole and/or the surface of the carrier body, the metal surface structure forming e.g. the contact pad, is formed. Next, material suitable for being used with additives manufacturing techniques is filled into the contact hole and onto the metal surface structure by additive manufacturing. Hence, by additive manufacturing, the metal body forming an electrical connection can be formed directly onto a metal surface structure for providing proper electrical conductivity. By additive manufacturing, complex structures of the metal body onto or within the metal body may be formed. Hence, by additive manufacturing, vias and/or contact layers having complex three-dimensional designs can be formed within or onto the carrier body.

Hence, the via present in the carrier body (e.g. the PCB) can be fabricated using additive manufacturing, such as SLM/SLS, by either filling pre-formed holes with e.g. conductive powder (copper Cu, silicon Si, silver Ag, Steel, titanium Ti, gold Au, etc.) for forming the metal body which will be then melted, or using the laser used e.g. in SLM/SLS machines to produce the hole through the carrier body and melt the material/powder bed on top of the PCB at the same time which will fill the hole. According to embodiments of the invention, the laser device in SLM/SLS machines can be first used to produce holes and then fill the hole with the powder and subsequent for solidifying, e.g. melting. The via formation/filling processes described above can be used in any kind of PCB as an alternative to conventional manufacturing techniques, i.e. mechanical/laser drilling, electro-less seed layer, galvanic plating via filling. An advantage is the possibility of mixing different metal combinations in the same PCB such as Al/Cu, Ti/Cu or steel/Cu. Another advantage of the process is to spare cleaning processes (smearing) that are needed in the production of proper PCB through-vias. The smearing process may be needed to prepare the hole properly before galvanization. New generations of materials, such as materials designed for 5G communication standards, present low polarization and this affects the smearing processes efficiency. Directly filling the PCB vias with additive processes such as SLM will revoke the need for smearing processes.

According to a further exemplary embodiment, the carrier body comprises a through hole between a first body surface and a second body surface of the carrier body, wherein the metal surface structure is formed within the through hole such that a first surface of the metal surface structure is accessible, in particular for an electronic component, and a second surface of the metal surface structure opposite to the first surface is in contact with the metal body. Hence, by the described design of the component carrier, a proper heat conduction between two opposing carrier body surfaces are provided. Hence, while on the one carrier body surface active or passive heat generating components are mounted, metal bodies functioning as a heat sink or a heat pipe may be formed by additive manufacturing at the opposed carrier body surface. The metal surface structure functions as a heat guidance through the carrier body. Thereby, between the heat generating components and the metal body, no further layers (e.g. adhesive layers), reducing the thermal conductivity, need to be applied.

According to a further exemplary embodiment, the component carrier comprises a component, in particular an electronic component, mounted on and/or embedded in the carrier body, wherein the component is in particular thermally coupled via the metal surface structure to the metal body. The metal surface structure connecting the embedded component and the heat sink in can be every kind of via type (plated through holes, blind vias, μ-vias, etc.) or can be fabricated directly via additive manufacturing, such as SLM or SLS.

According to a further exemplary embodiment, the electrical component is attached to a carrier body surface of the carrier body. The metal surface structure is formed between the carrier body surface and the electrical component for providing a thermal connection.

According to a further exemplary embodiment, the carrier body surface comprises a receiving recess within the electrical component is arranged. The receiving recess may be formed by etching or by mechanical drilling/milling.

According to a further exemplary embodiment, the metal surface structure is formed by a metal surface of the component. Hence, the component may comprise for example a thermally conductive casing or (thermal and/or electrical)

contact area, such as metal contact or a metal casing. The part of the surface of the component is accessible from the environment, so that the metal body may be directly formed by additive manufacturing on the part of the surface of the component.

According to a further exemplary embodiment, the component is embedded in the carrier body and being thermally coupled via the metal surface structure to the metal body.

According to a further exemplary embodiment, the carrier body comprises an internal receiving cavity into which the component is embedded. At least one of the plurality of electrically conductive layer structures and/or electrically insulating layer structures is arranged between a surface of the metal body and the receiving cavity. The at least one thermal channel is formed in the at least one of the plurality of electrically conductive layer structures and/or electrically insulating layer structures between the receiving cavity and the surface of the metal body arranged on a surface of the carrier body. The at least one thermal channel is filled with at least a part of the metal surface structure. The thermal channels may be formed by etching or by mechanical/laser drilling.

According to a further exemplary embodiment, the at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

According to an exemplary embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

According to an exemplary embodiment, the component carrier is configured as one of the group consisting of a printed circuit board, and a substrate (in particular an IC substrate). In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the component carrier is a laminate-type component carrier. In such an embodiment, the component carrier is a compound of multiple layer structures which are stacked and connected together by applying a pressing force, if desired accompanied by heat.

The following, exemplary embodiments of the method according to the present invention will be described.

According to an exemplary embodiment of the method, the additive manufacturing comprises applying a printing material to an application device, melting the printing material in the application device and applying the melted printing material on the metal surface structure for forming at least on layer of the metal body. The application device may be for example the printer head functioning as e.g. an extruder device comprising a heater for melting the printing material and an ejection element, such as a nozzle, for ejecting the melted printing material in form of droplets or thin melted material beams to the desired location at the metal surface structure.

For example, the application device may form the metal body layer by layer. A thickness of a layer may be around 50 μm. During the manufacturing process, more than one application device may be used and different materials may be applied for simultaneously manufacturing more than one metal body. The used meltable material may be made of an electrically conductive material, e.g. copper, or it may be enriched with electrically conductive material compounds. The printing material may be for example a powder material or granulate.

According to a further exemplary embodiment of the method, the additive manufacturing comprises applying a printing (powder or granulate) material on the metal surface structure and consolidating (i.e. solidifying/hardening) the applied printing material by e.g. i.e. by sintering or melting using a thermal treatment device, in particular by a laser device, for forming at least one layer of the metal body. The term "consolidating" may particularly denote any step or activity for bringing the printed material in a solid state, wherein the solid state is the state of at least one layer structure made of the printing material. For example consolidating may be at least one of the following: adhering, gluing, curing, tempering, solidifying, melting and hardening or hardening of the printing material.

According to a further exemplary embodiment of the method, the metal body may be formed by at least one of the group consisting of selective laser melting (SLM), selective laser sintering (SLS), and electron beam melting (EBM, electron beam additive manufacturing EBAM).

According to a further exemplary embodiment of the method, before consolidating the printing material, the printing material is melted by a thermal treatment device, in particular a laser device. The single layers of the metal body are melted or sintered by means of a thermal treatment device, such as a laser, which is called selective laser sintering (SLS) or selective laser melting (SLM). Hence, metals, ceramics and sand may be used for SLS or SLM. If the SLS or SLM method is used for manufacturing, the forming of the layer of the powder material is performed by means of a laser, wherein the laser melts or sinters the powder material for forming at least one layer of the metal body. When using SLM or SLM manufacturing methods an adhesive or adhesive layer for forming the metal body may be obsolete.

Further, the powder may be melted by the use of a controllable electron beam, which will be called electron beam melting (EBM). This manufacturing process may allow to use materials comprising a higher melting point e.g. for melting also titanium materials.

According to a further exemplary embodiment of the method, the printing material is applied by a material (e.g. powder) delivery nozzle. Hence, a printer head may comprise the material delivery nozzle. The printer head may further comprise a material storage which contains the printing material. The printer head may control the amount of printing material delivered by the nozzle to the desired location.

According to a further exemplary embodiment, the method comprising moving the material delivery nozzle for forming the layer or a further layer of the metal body. Specifically, the printer head comprising the delivery nozzle may be movable along two or along three spatial directions so that the application location of the printing material onto the metal surface structure may be adjusted and additionally the distance between the material delivery nozzle and the metal surface structure may be adjusted.

According to a further exemplary embodiment, before the printing material is applied on the metal surface structure, the carrier body is provided into a material (i.e. powder) bed. The carrier body may be adjusted in the material bed such that the metal surface structure, which is formed on or in the carrier body is arranged with a defined distance to a surface of the material bed. Hence, between the environment and the metal surface structure, a desired thickness of printing material is arranged. Next, by a treatment device as described below, which may be a thermal treatment device for applying thermal energy to the metal surface structure or for radiating (e.g. by an ultraviolet laser) a predefined wavelength of light for photopolymerization to the metal surface structure, solidifies the applied printing material between the surface of the material bed and the metallic surface structure. According to an exemplary embodiment the fluid material is a photosensitive material. This process may also be used with mixed materials such as ceramic, metallic and photopolymer mixtures. During this process also more than one laser may be used. In particular the fluid material may be photosensitive under the ultraviolet light of the laser. A further process using fluidic materials may be the multi-jet modelling, poly jet method. In this process of fluidic light-sensitive plastic is applied onto a platform by a print-head and is immediately cured by a light source (e.g. a laser) integrated in the print-head (e.g. the laser device).

According to a further exemplary embodiment, the method comprises moving the carrier body for forming a further layer of the metal body. In particular, after solidifying a first layer the metal body, the carrier body may be moved, in particular may be lowered, such that a further layer of printing material is arranged between the solidified first layer of the metal body and the surface of the material bed. Next, the further powder layer may be solidified by the treatment device.

According to a further exemplary embodiment of the method, the carrier body is arranged in a container. According to this exemplary embodiment, the additive manufacturing comprises providing a solidifiable fluid material in the container, solidifying the fluid material by a treatment device, in particular a laser device, on the metal surface for forming at least one layer of the metal body. The present exemplary embodiment functions similar to the described embodiment above using the powder material. The carrier body may be adjusted in the container such that the metal surface structure, which is formed on or in the carrier body is arranged with a defined distance to a surface of the solidifiable (e.g. liquid) fluid material. Hence, between the environment and the metal surface structure, a desired thickness of fluid material is positioned. Next, by a treatment device for applying thermal energy to the metal surface structure or for radiating a predefined wavelength of light for photopolymerization to the metal surface structure, solidifies the fluid between the surface of the powder bed and the metallic surface structure.

In particular, after solidifying a first layer the metal body, the carrier body may be moved in the container, in particular may be lowered, such that a further layer of solidifiable fluid is arranged between the solidified first layer of the metal body and the surface of the solidifiable fluid. Next, the further fluid layer may be solidified by the treatment device.

Hence, according to the exemplary embodiments of the method described above, by selective laser sintering/melting (SLS/SLM) as additive manufacturing of the metal body (e.g. the heat sink) on the metal surface structure (such as on aluminum or copper inlays of the carrier body) which have been previously integrated into the carrier body (i.e. the PCB). Alternatively, a package with the metal surface structure may also be used as a base from where to start the additive manufacturing the metal body, functioning for example as a heat sink. SLS/SLM is a process based on the local sintering/melting of a powder bed or solidifiable fluid material, supplied either layer by layer (e.g. if the carrier body is arranged within a powder bed or a container comprising the carrier body as described above) or by local delivering the material where needed, e.g. by a printer head as described above. The resolution of the features realized by SLS and SLM is related to both the powder particle size and the laser spot diameter, i.e. the smaller the grains and laser spot the finer will be the minimum feature size. However, finer particle dimensions imply a higher reactivity of the powder (mainly oxidation in the case of metals) at atmospheric conditions.

The printing (powder) material and/or the solidifiable fluid material may consist of components of metal material (e.g. aluminum Al, silver Ag, titanium Ti, bronze, steel, nickel Ni, copper Cu, copper-chrome Co-Cr, gold Au, tantalum Ta, wolfram W, molybdenum Mo and respective alloys thereof), thermoplastics (e.g. Nylon, Polyamide, Polystyrene), Elastomers, Composites and or FR materials.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this document.

BRIEF DESCRIPTION OF THE DRAWINGS

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1:
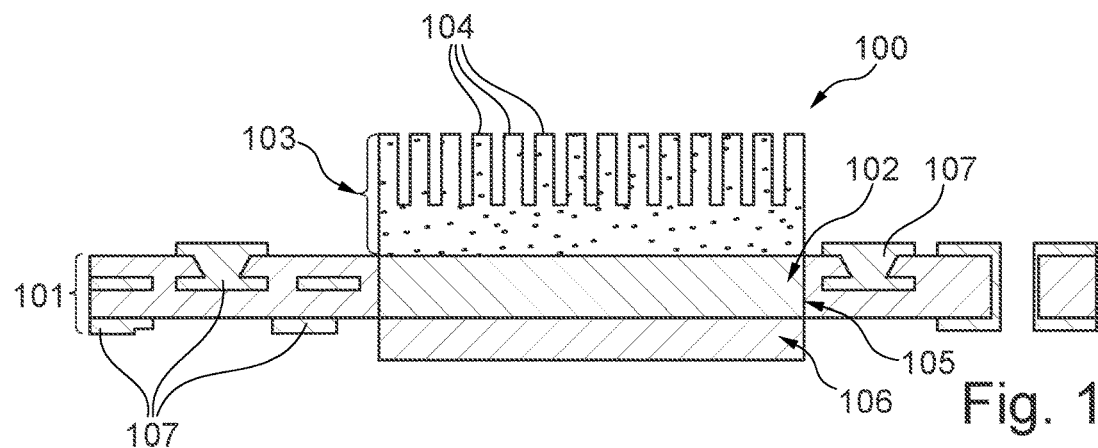
FIG. 1, FIG. 2, FIG. 3 and FIG. 4 show schematic views of component carriers comprising metal bodies forming a heat sink according to exemplary embodiments of the present invention.

The illustrations in the drawings are schematically presented. It is noted that in different figures similar or identical elements are provided with the same reference signs.

FIG. 1 shows a component carrier 100 comprising a metal body 103 forming in particular a heat sink according to an exemplary embodiment of the present invention. The component carrier 100 comprises a carrier body 101 formed of a plurality of electrically conductive layer structures and/or electrically insulating layer structures, a metal surface structure 102 on the layer structures and the metal body 103 which is formed directly on the metal surface structure 102 by additive manufacturing.

A stack of the plurality of electrically conductive layer structures and/or electrically insulating layer structures are connected for forming the carrier body 101. The metal surface structure 102 is formed on or in the layer structures. The metal body 103 is formed directly on the metal surface structure 102 by additive manufacturing. For example, the carrier body 101 may be a laminate of the mentioned electrically insulating layer structure(s) and electrically conductive layer structure(s), in particular formed by applying mechanical pressure, if desired supported by thermal energy.

Furthermore, within the carrier body 101 or formed on a surface of the carrier body 101 contacting lines/pads 107 are formed. The contacting lines/pads 107 form an electrical connection with the component 106 or other devices.

The metal surface structure 102 forms a thermal coupling to the metal body 103. The carrier body 101 comprises a through-hole 105 between a first body surface and a second body surface of the carrier body 101. The metal surface structure 102 is formed within the through-hole 105 such that a first surface of the metal surface structure is accessible, in particular for an electronic component 106. A second surface of the metal surface structure 102 opposite to the first surface is in contact with the metal body 103. Hence, by the described design of the component carrier in FIG. 1, a proper heat conduction between two opposing carrier body surfaces are provided. Hence, while on the one carrier body surface active or passive heat generating components 105 are mounted, metal bodies 103 functioning as a heat sink or a heat pipe may be formed by additive manufacturing at the opposed carrier body surface. The metal surface structure 102 functions as a heat guidance through the carrier body 101. Thereby, between the heat generating components 106 and the metal body 103, no further layers (e.g. adhesive layers), reducing the thermal conductivity, need to be applied. Through hole 105 may be formed by mechanical/ laser drilling or by etching.

The metal body 103 is formed on the metal surface structure 102 by additive manufacturing, without the need of further intermediate adhesive layers between the metal body 103 itself and the metal surface structure 102.

The metal body 103 comprises cooling fins 104. Cooling fins 104 form protrusions protruding from the surface of the metal body 103 in order to increase the overall surface area of the metal body 103. Hence, the overall surface area provides a larger radiation surface, so that the thermal conductivity with the environment of the component carrier 100 can be improved.

Figure 2:
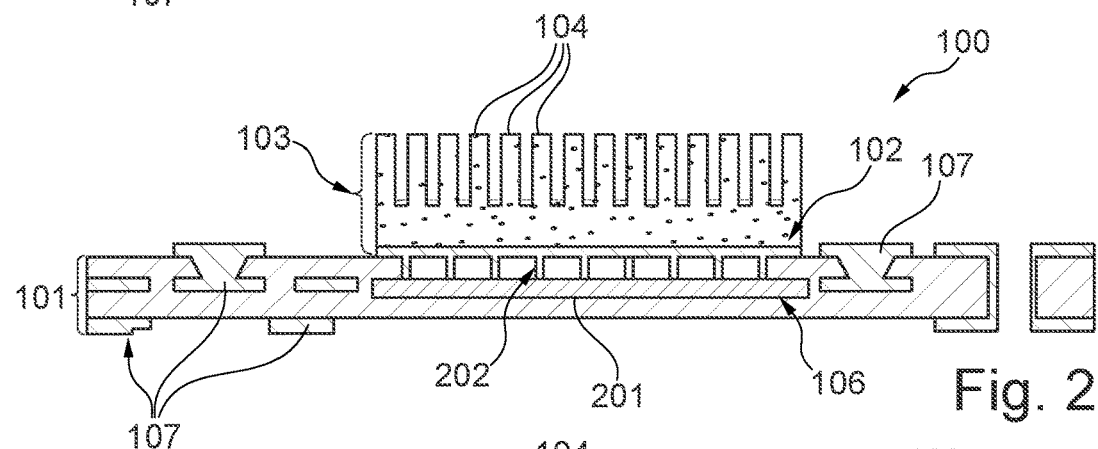

FIG. 2 shows a further exemplary embodiment of a component carrier 100 comprising a metal body 103 functioning as a heat sink. The component 106 is embedded in the carrier body 101 and being thermally coupled via the metal surface structure 102 to the metal body 103.

The carrier body 101 comprises an internal receiving cavity 201 into which the component 106 is embedded. At least one of the plurality of electrically conductive layer structures and/or electrically insulating layer structures as forming an intermediate layer structure is arranged between a surface of the metal body 103 and the receiving cavity 201. Thermal channels 202 are formed in the intermediate layer structures between the receiving cavity 201 and the surface of the metal body 103 arranged on a surface of the carrier body 101. The at least one thermal channel is filled with the metal surface structure 102. The thermal channels 202 may be formed by etching or by mechanical/laser drilling of the intermediate layer structure.

Figure 3:
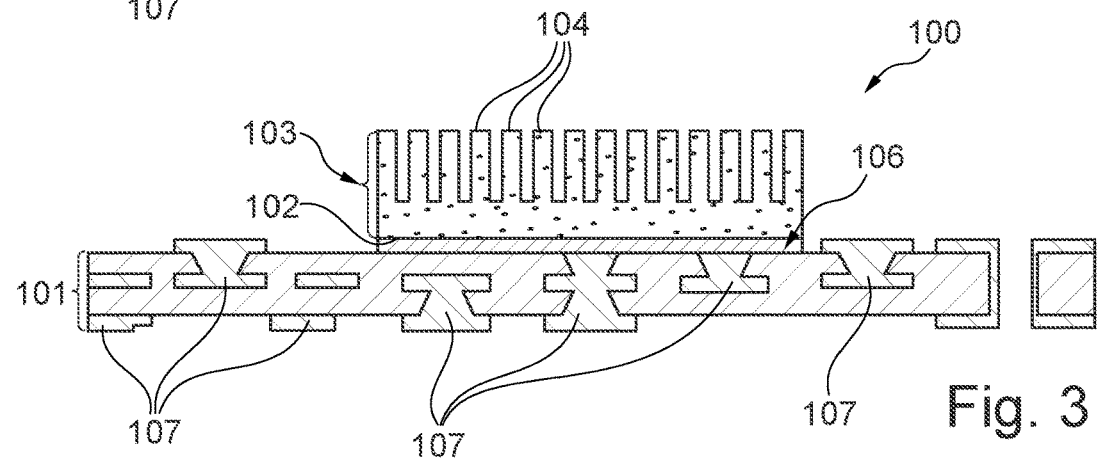

FIG. 3 shows a further exemplary embodiment of a component carrier 100 comprising a metal body 103 functioning as a heat sink. The component 106 is arranged on a carrier body surface. The metal surface structure 102 is formed by a metal surface of the component 106. Hence, the component 106 may comprise for example a thermally conductive casing or (thermal and/or electrical) contact area, such as metal contact or a metal casing. The part of the surface of the component 106 is accessible from the environment, so that the metal body 106 is directly formed by additive manufacturing on the part of the surface of the component 106.

Figure 4:
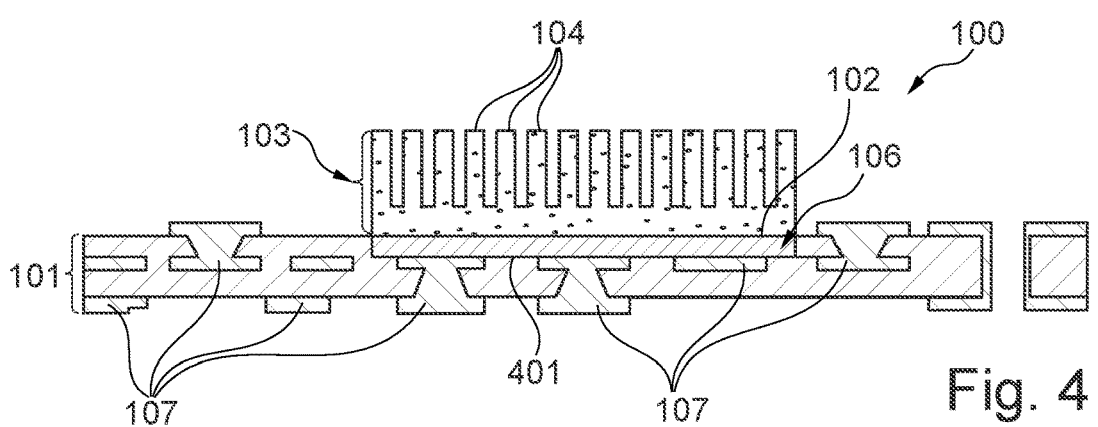

FIG. 4 shows a further exemplary embodiment of a component carrier 100 comprising a metal body 103 functioning as a heat sink. The carrier body 101 and its surface, respectively, comprises a receiving recess 401 within the electrical component 106 is arranged. The receiving recess 401 may be formed by etching or by mechanical drilling/milling.

Figure 5:
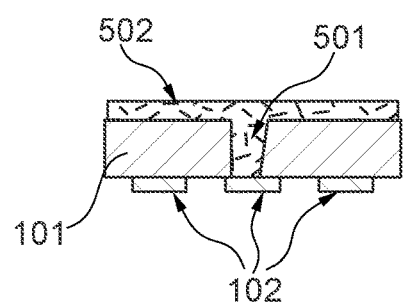
FIG. 5, FIG. 6 and FIG. 7 show schematic views of a method of forming a component carrier comprising an electrical contact structure according to an exemplary embodiment of the present invention.
Figure 6:
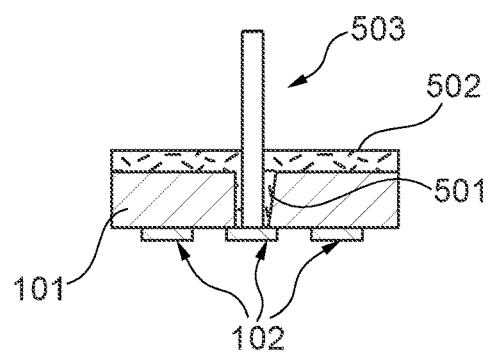
Figure 7:
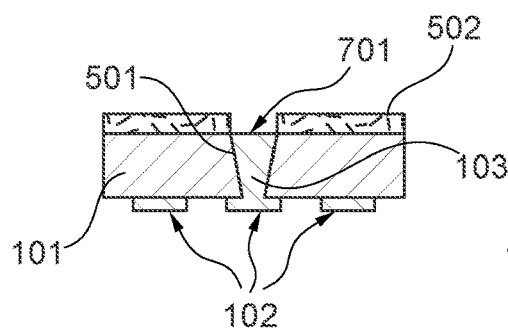

FIG. 5 to FIG. 7 show schematic views of a method of forming a component carrier 100 comprising an electrical contact structure 701 according to an exemplary embodiment of the present invention. Accordingly, the metal surface structure 102 forms an electrical contact element or structure 701, in particular a contact pad, a contact line or a plated area. The metal body 103 is formed within a contact hole 501 of the carrier body 103, such that the metal body 103 and the metal surface structure 102 forms the electrical contacting structure 701.

The contact hole 501 is formed by mechanical drilling or by etching in the carrier body 101. Furthermore, the metal surface structure 102 is arranged on a carrier body surface or embedded within the carrier body 101. As can be seen from FIG. 5, the metal surface structure 102 forms a cover of the hole 501. Next, printing material (i.e. powder material) 502 suitable for being used with additives manufacturing techniques is filled into the contact hole 501 and onto the metal surface structure by additive manufacturing.

Next, as can be taken from FIG. 6, additive manufacturing procedures are applied. Accordingly, a treatment device generates a laser beam 503 for melting or sintering the printing material 502. In FIG. 7 it is shown, that after applying the laser beam 503 and hence solidifying the printing material 502 an electrical contact structure 701.

Hence, the via present in the carrier body 101 (e.g. the PCB) can be fabricated using additive manufacturing, such as SLM/SLS, by filling pre-formed holes 501 with e.g. conductive powder 502 (Cu, Si, Ag, Steel, Ti, Au, etc.) for forming the metal body 103 which will be then melted by the laser beam 503.

Figure 8:
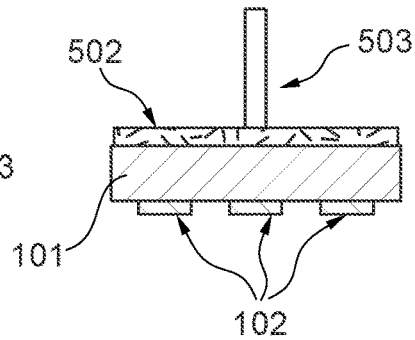
FIG. 8, FIG. 9 and FIG. 10 show schematic views of a method of forming a component carrier comprising an electrical contact structure according to an exemplary embodiment of the present invention.
Figure 9:
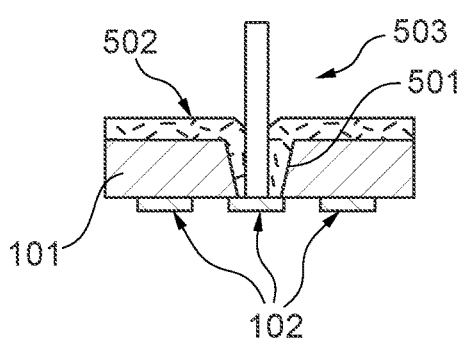
Figure 10:
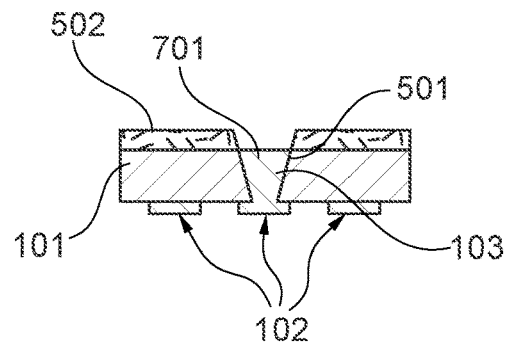

FIG. 8 to FIG. 10 show schematic views of a method of forming a component carrier 100 comprising an electrical contact structure 701 according to an exemplary embodiment of the present invention. Accordingly, the metal surface structure 102 forms an electrical contact element or structure 701, in particular a contact pad, a contact line or a plated area. The metal body 103 is formed within a contact hole 501 of the carrier body 103, such that the metal body 103 and the metal surface structure 102 forms the electrical contacting structure 701.

The metal surface structure 102 is arranged on a carrier body surface or embedded within the carrier body 101. As can be seen from FIG. 8, the metal surface structure 102 forms a cover of the hole 501. Next, material (i.e. powder material) 502 suitable for being used with additive manufacturing techniques is filled into the contact hole 501 and onto the metal surface structure by additive manufacturing.

The contact hole 501 in the exemplary embodiment in FIG. 8 is formed by using the laser beam 503 used in e.g. a SLM/SLS machine to produce the hole 501 through the carrier body 101 and melt the powder bed 502 on top of the PCB 101 at the same time which will fill the hole. The laser device generating the laser beam 503 in e.g. a SLM/SLS machine can be first used to produce holes 501 and then after filling the hole 501 with the printing material 502 subsequent melting or sintering the printing material 502. Hence, as can be taken from FIG. 9, the laser beam 503 melts or sinters the printing material 502. In FIG. 10 it is shown, that after applying the laser beam 503 and hence after solidifying the printing material an electrical contact structure 701 is formed.

Figure 11:
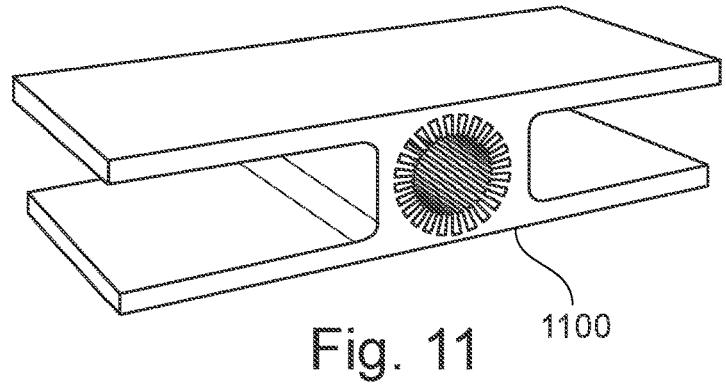
FIG. 11 shows a schematic view of a metal body forms as a heat pipe according to an exemplary embodiment of the present invention.

FIG. 11 shows a schematic view of a metal body 103 formed as a heat pipe 1100 according to an exemplary embodiment of the present invention. The metal heat pipe 1100 comprises an inner cavity along which an internal cooling fluid is flowable. As can be taken from FIG. 11, cooling fins may be formed inside the inner cavity. The heat pipe 1100 functions as a heat-transfer device for transferring heat away from the component 106 and the metal surface structure 102, respectively.

Figure 12:
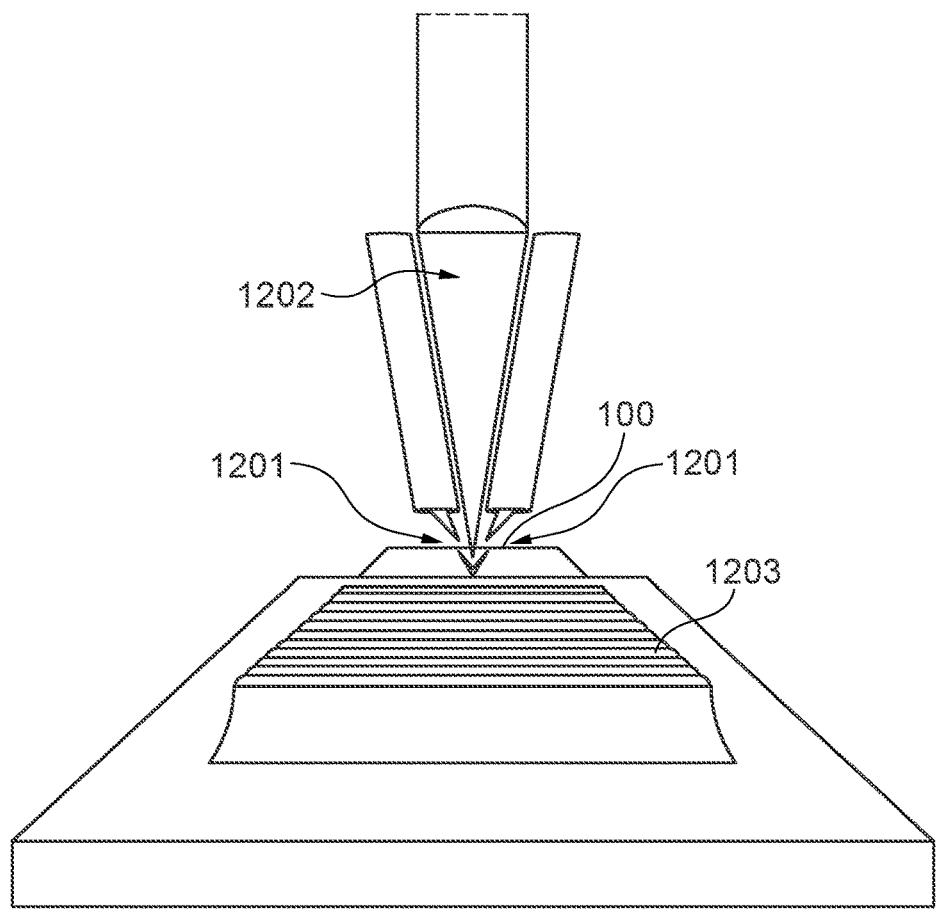
FIG. 12 shows a schematic view of a manufacturing tool for forming a component carrier according to an exemplary embodiment of the present invention.

FIG. 12 shows a schematic view of a manufacturing tool for forming a component carrier 100 according to an exemplary embodiment of the present invention.

The component carrier 100 may be arranged onto a moving platform 1203. The moving platform 1203 remove the component carrier 100 along two or three spatial directions with respect to a printer head. The printer head comprises for example material delivery nozzles 1201. A printing material, such as a powder material, may be injected by the material delivery nozzles 1201 to a desired spot onto the metal surface structure 102 and/or a layer of the metal body 103. Simultaneously or subsequently, a laser device 1202 of the printer head focuses a laser beam to the desired spot in order to melt or sinter the printing material.

Figure 13:
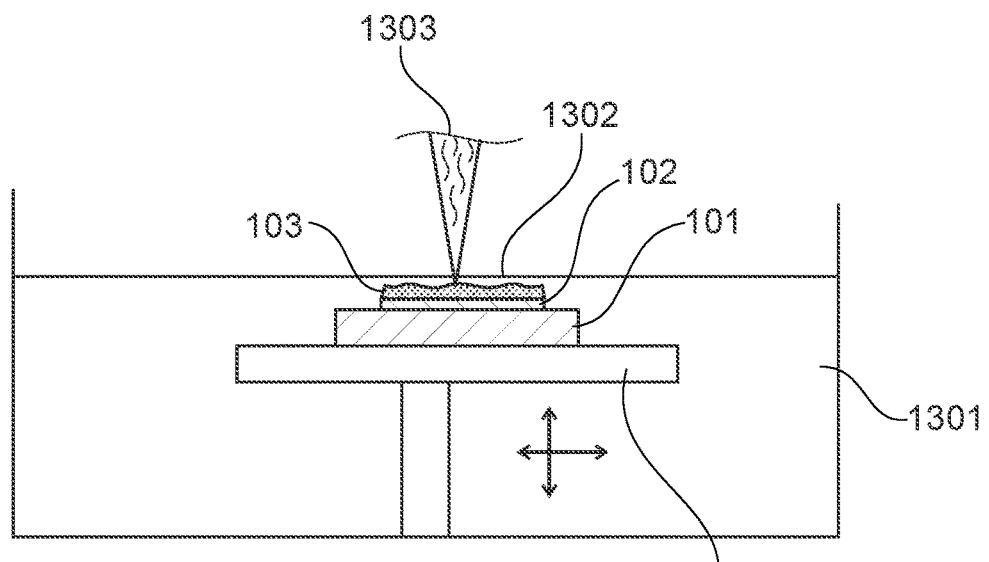
FIG. 13 shows a schematic view of a manufacturing tool for forming a component carrier according to an exemplary embodiment of the present invention.

FIG. 13 shows a schematic view of a manufacturing tool for forming a component carrier according to an exemplary embodiment of the present invention. A fluid material and specifically a powder material suitable for conducting additive manufacturing is filled in a container for providing a fluid bed, in particular material/powder bed 1301. A moving platform 1203 is arranged within the container and is movable at least along one spatial direction, specifically in the direction to a surface of the material bed 1301.

The carrier body 101 is arranged inside the material bed 1301 onto the moving platform 1203. The metal surface structure 102 is formed in or onto the carrier body 101 (for example by additive manufacturing). The metal surface structure 102 is arranged with a defined distance to a surface of the material bed 1301. Hence, between the environment and the metal surface structure 102, a desired thickness of a solidifiable metal body layer 1302 of powder material 1302 is formed. Next, by a treatment device 1303, which may be a thermal treatment device for applying thermal energy to the metal surface structure 102 or for radiating a predefined wavelength of light for photopolymerization to the metal surface structure 102, solidifies the applied printing material between the surface of the material bed 1301 and the metallic surface structure 102.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

LIST OF REFERENCE SIGNS 100 component carrier
101 carrier body
102 metal surface structure
103 metal body
104 cooling fins
105 through hole
106 component
107 conductive pads/lines
201 internal receiving cavity
202 channel
401 receiving recess
501 hole
502 printing/powder material
503 laser beam
701 electrical contact structure
1100 heat pipe
1201 material/powder delivery nozzle
1202 laser device
1203 moving platform
1301 material/powder bed
1302 solidifiable metal body layer
1303 treatment device

The invention claimed is:

1. A component carrier, comprising:
a carrier body formed of a plurality of electrically conductive layer structures and/or electrically insulating layer structures;
a component with a metal surface structure mounted on or in the carrier body, the metal surface structure of the component extending beyond an external surface of the carrier body and directly coupled to the layer structures, wherein at least a portion of the metal surface structure contacts at least one of a thermally conductive casing and a contact area of the component; and
a metal body directly on the metal surface structure, the metal body outside of the carrier body,
wherein the metal body is directly formed by additive manufacturing on the metal surface structure without an isolating layer between the component and the metal body.

2. The component carrier according to claim 1,
wherein the metal body comprises a material selected of at least one of the group consisting of copper, aluminum, silver, nickel, bronze, gold, titanium, tantalum, wolfram, molybdenum and steel.

3. The component carrier according to claim 1,
wherein the metal body comprises cooling fins,
wherein the cooling fins comprise a fractal geometry.

4. The component carrier according to claim 1,
wherein the metal body is a heat removal body arranged for forced water flow,
wherein the metal body functioning as a heat pipe comprises a tube extending at least partially along the metal surface structure,
wherein the tube surrounds at least partially a heat generating component.

5. The component carrier according to claim 1,
wherein the metal body comprises at least one locally roughened surface which has a higher roughness than other surfaces of the metal body for providing a heat exchange with a cooling medium or enhanced irradiation,
wherein the metal surface structure or the metal body forms an electrical contact element selected from the group consisting of a contact pad, a contact line or a plated area,
wherein the carrier body comprises a through hole between a first body surface and a second body surface of the carrier body,
wherein the metal surface structure is formed within the through hole such that a first surface of the metal surface structure is accessible for an electronic component, and
a second surface of the metal surface structure opposite to the first surface is in contact with the metal body.

6. The component carrier according to claim 1, further comprising:
wherein the component is thermally coupled via the metal surface structure to the metal body,
wherein the component is attached to a carrier body surface of the carrier body,
wherein the metal surface structure is formed between the carrier body surface and the component for providing a thermal connection,
wherein the carrier body surface comprises a receiving recess within which the component is arranged.

7. The component carrier according to claim 1,
wherein the component is thermally coupled via the metal surface structure to the metal body,
wherein the carrier body comprises an internal receiving cavity into which the component is embedded,
wherein at least one of the plurality of electrically conductive layer structures and/or electrically insulating layer structures is arranged between a surface of the metal body and the receiving cavity, wherein at least one channel is formed in the at least one of the plurality of electrically conductive layer structures and/or electrically insulating layer structures between the receiving cavity and the surface of the metal body arranged on a surface of the carrier body, wherein the at least one channel is filled with at least a part of the metal surface structure, wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip, wherein the at least one electrically conductive layer structure comprises at least one of the group consisting of copper, aluminum, nickel, silver, gold, palladium, and tungsten.

8. The component carrier according to claim 1, wherein the at least one electrically insulating layer structure comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide, wherein the component carrier is shaped as a plate, wherein the component carrier is configured as one of the group consisting of a printed circuit board, and a substrate, wherein the component carrier is configured as a laminate-type component carrier.

9. A method of manufacturing a component carrier, the method comprising:

connecting a stack of a plurality of electrically conductive layer structures and/or electrically insulating layer structures for forming a carrier body;

integrating a component on and/or embedded in the carrier body, forming a metal surface structure beyond an external surface of the carrier body and directly coupled to the layer structures and the component, wherein at least a portion of the metal surface structure contacts at least one of a thermally conductive casing and a contact area of the component; and forming a metal body outside the carrier body directly on the metal surface structure without an isolating layer between the component and the metal body.

10. The method according to claim 9, further comprising:
applying a printing material to an application device,
melting the printing material in the application device,
applying the melted printing material on the metal surface structure for forming at least one layer of the metal body.

11. The method according to claim 9, further comprising:
applying a printing material on the metal surface structure,
consolidating the applied printing material for forming at least one layer of the metal body,
wherein the at least one layer of the metal body is formed by at least one of the group consisting of selective laser melting, selective laser sintering, and electron beam melting,
wherein before consolidating the printing material, the printing material is melted by a thermal treatment device,
wherein the printing material is applied by a material delivery nozzle.

12. The method according to claim 11, further comprising:
moving the material delivery nozzle for forming a further layer of the metal body.

13. The method according to claim 11,
wherein before the printing material is applied on the metal surface, the carrier body is moved into a material bed consisting of the printing material,
wherein the method further comprises moving the carrier body for forming a further layer of the metal body.

14. The method according to claim 9,
wherein the carrier body is arranged in a container,
providing a solidifiable fluid material in the container,
solidifying, by a treatment device, the fluid material on the metal surface for forming at least one layer of the metal body,
wherein the fluid material is a photosensitive material,
wherein the method further comprises:
moving the carrier body for forming a further layer of the metal body.

15. A component carrier, comprising:
a carrier body formed of a plurality of electrically conductive layer structures and/or electrically insulating layer structures, the carrier body forming a cavity into which a component is embedded;
a metal surface structure coupled to the layer structures and extending beyond an external surface of the carrier body; and
a metal body directly on the metal surface structure,
wherein the component is thermally coupled via the metal surface structure to the metal body,
wherein at least one of the plurality of electrically conductive layer structures and/or electrically insulating layer structures is arranged between a surface of the metal body and the component in the cavity,
wherein at least one channel is formed in the at least one of the plurality of electrically conductive layer structures and/or electrically insulating layer structures between the cavity and the surface of the metal body arranged on a surface of the carrier body,
wherein the at least one channel is filled with at least a part of the metal surface structure,
wherein the metal surface structure and the metal body are not in contact with an isolating layer.

* * * * *